United States Patent

Phlieger, Jr.

[15] 3,639,809
[45] Feb. 1, 1972

[54] UNIVERSAL ENVIRONMENT PACKAGE WITH SECTIONAL COMPONENT HOUSING

[72] Inventor: Graydon A. Phlieger, Jr., Cocoa, Fla.

[73] Assignee: The United States of America as represented by the Administrator of the National Aeronautics and Space Administration

[22] Filed: Dec. 16, 1970

[21] Appl. No.: 98,773

[52] U.S. Cl. ....................317/117, 220/5 R, 317/120, 317/101 DH

[51] Int. Cl. ....................H05k 5/06, B65d 7/06

[58] Field of Search..........174/50, 52 R; 317/101 R, 101 CB, 317/101 DH, 99, 117, 120; 220/4 R, 5 R

[56] References Cited

UNITED STATES PATENTS

| | | | |
|---|---|---|---|
| 3,044,655 | 7/1962 | Rebikoff | 220/4 R |
| 3,479,568 | 11/1969 | Shapiro | 317/210 |

*Primary Examiner*—Lewis H. Myers
*Assistant Examiner*—Gerald P. Tolin
*Attorney*—James O. Harrell and John R. Manning

[57] ABSTRACT

A housing that can be readily assembled for packaging equipment, such as electrical components and meters. The housing includes a pair of spaced end rings, each of which has an endless groove in the inner wall thereof. A thin elongate shell is positioned within the groove and end plates are carried adjacent ridges on the opposite side of the end rings. Bolts extend through the panels for drawing the panels flush against ridges carried on the end ring and supporting panel boards within the housing. Thus, an airtight package or housing can be readily assembled.

5 Claims, 4 Drawing Figures

Figure 1:
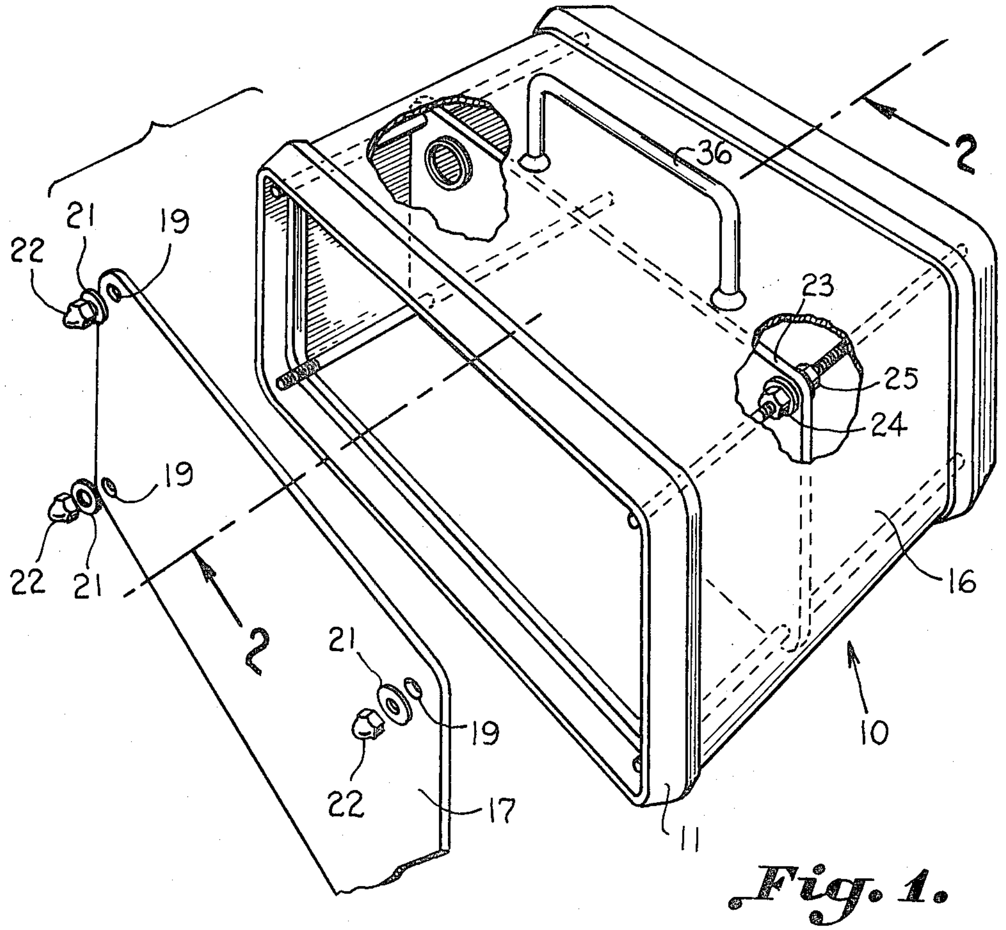

INVENTOR.
GRAYDON A. PHLIEGER, JR.
BY
James O. Harrell
ATTORNEY.

INVENTOR.
GRAYDON A. PHLIEGER, JR.
BY
James O. Harrell
ATTORNEY.

UNIVERSAL ENVIRONMENT PACKAGE WITH SECTIONAL COMPONENT HOUSING

This invention described herein was made by an employee of the U.S. Government, and may be manufactured and used by or for the Government for Governmental purposes without the payment of any royalties thereon or therefor.

This invention relates to a package, and more particularly to a universal environment package which can be used where compactness, environmental protection, and ease of assembly are of prime importance.

Frequently, in test areas and in laboratories it is often necessary to house circuits which are being utilized in tests. Heretofore, when it was desired to place such circuits in a housing such houses were fabricated for the particular circuit. This not only was extremely time consuming, but was expensive since each housing was fabricated separately. Therefore, it is desired that a kit package be produced and stocked that can be readily assembled by test engineers and the like, for mounting electronic circuits and components while affording protection against various undesired environments.

Another desired feature is to have a package which can be varied internally in size and configuration so as to allow the circuits and components to be modified without discarding the container in which such are carried.

In accordance with the present invention, it has been found that difficulties encountered in overcoming the problem of conveniently and readily packaging electronic equipment and the like, may be overcome by providing a novel package or housing. The housing, when used for accommodating electronic circuits and components includes the following basic parts: (1) A first end ring having an inner wall and outer wall constructed of polymeric material, (2) the end ring has a groove disposed in an inner wall opening rearwardly and extending around the ring, (3) a vertical ridge extends around the outer wall on an opposite side of the ring from the groove, (4) an outwardly extending flange integral with the vertical ridge and extending around the ring, (5) a second end ring corresponding to the first end ring spaced from the first end ring with the groove facing the groove of the first end ring, (6) a thin wall elongated shell having a peripheral dimension corresponding to the grooves so that a front edge is carried in the groove of the first ring and a rear edge is carried in the groove of the second ring, (7) a front panel carried flush against the vertical ridge of the first end ring, (8) a rear panel carried flush against the vertical edge of the second end ring, (9) elongated bolts extending between the front and rear panels for drawing the panels together firmly against the ridges and for holding the edges of the shell within the grooves, (10) and spaced vertical panel boards carried on the elongated bolts within the shell between the front and rear panels for accommodating electronic components and circuits.

Accordingly, it is an important object of the present invention to provide a housing which is capable of readily being assembled and packaging electronic components on circuit boards and the like.

Another important object of the present invention is to provide a housing which can be readily enlarged.

Another important object of the present invention is to provide a simple, and inexpensive universal housing that can be utilized to accommodate various electrical components and circuits, as well as other types of components.

Still another important object of the present invention is to provide a housing that can be readily assembled that is substantially airtight and minimizes shock created by bumping and handling to components carried therein.

A further object of the present invention is to provide a housing which utilizes polymeric rings which serve as bumper edges all around a metal container that prevents sharp metal edges of test sets from damaging sensitive equipment, when used inside areas such as spacecraft.

Figure 2:
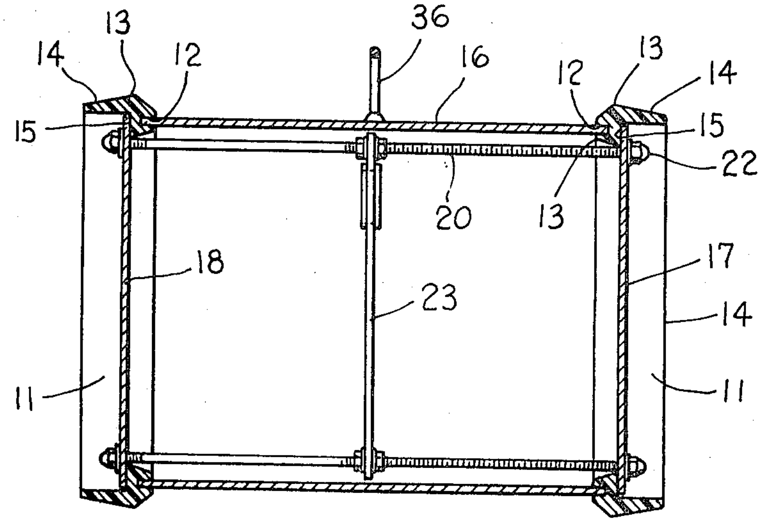
Figures 3, 4:
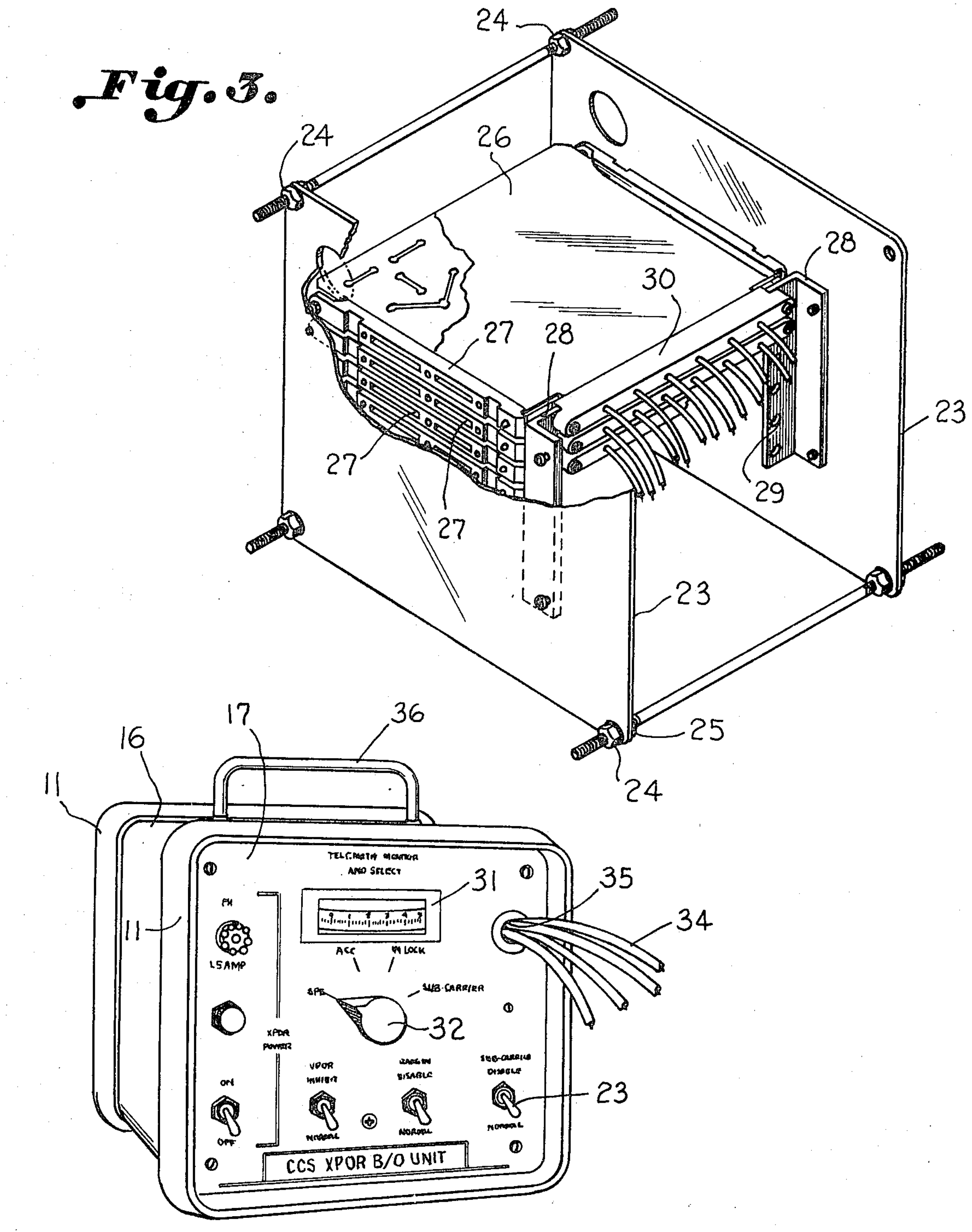

Other objects and advantages of this invention will become more apparent from a reading of the following detailed description and appended claims, taken in conjunction with the accompanying drawings wherein:

FIG. 1 is an exploded perspective view, with parts broken away, illustrating a housing constructed in accordance with the present invention, FIG. 2 is a cross-sectional view taken along the line 2—2 of FIG. 1, FIG. 3 is an enlarged perspective view, with parts removed, illustrating printed circuit boards carried between panel boards that are mounted on bolts which extend through the housing, and FIG. 4 is a perspective view illustrating the front panel of the housing with electrical components mounted thereon.

Referring in more detail to the drawings, FIG. 1 illustrates a housing generally designated by the reference character 10 which is provided for receiving electrical components and circuits. The housing has a first end ring 11 which is constructed of polyurethane so as to absorb shocks and the like. The rectangular end ring 11 has a groove 12 disposed in an inner wall 13 which opens towards the interior of the housing. The groove 12 extends around the entire periphery of the inner wall of the end ring. From the groove 12 the end ring extends outwardly to an apex 13 and terminates in an outwardly extending flange 14. The outwardly extending flange 14 aids in protecting any components that may be carried on the end panels. A vertical ridge 15 extends around an outer wall of the ring opposite the groove 12. An identical second end ring 11 is spaced from the first end ring with the groove 12 facing the groove of the first end ring.

A thin wall elongated, rectangular shell 16, which has a peripheral dimension corresponding to the dimension of the grooves, is carried between the grooves 12 of the first and second end rings. It is noted that the front edge of the shell 16 extends into the groove (see FIG. 2) of the end ring 11 on the right, while the rear edge of the shell 16 extends within the groove 12 of the end ring on the left. The shell may be constructed of any suitable material, such as aluminum, or for smaller shells can be constructed of any suitable polymeric material. When it is desired that the container be airtight a rubber adhesive sealing material is inserted within the grooves 12 prior to placing the ends of the shell therein. This produces a seal between the shell and the end rings 11.

A front rectangular panel 17 is positioned within the rectangular flange 14 flush against the vertical ridge 15 of the end ring. A similar rear panel 18 is carried flush against the vertical ridge 15 of the other end ring. The panels 17 and 18 have holes 19 adjacent their corners for receiving an elongated threaded rod or bolt 20. This elongated threaded rod is threaded its entire length and extends from the front panel 17 to the rear panel 18. A washer 21 is placed on the end of the rod and a nut 22 is screwed thereagainst to draw the panel flush against the vertical ridge 15. A similar washer 21 and nut 22 are carried on the other end of the rod 20. When the nuts 22 are drawn up tightly such draws the panels 17 and 18 flush against the vertical ridges 15 and, also, forces the edges of the shell 16 within the grooves 12. This produces a sealed housing in which electrical components can be carried.

Spaced vertical, rectangular panels boards 23 are carried on the rods 20 for accommodating electrical circuit components and any other fixtures that may be desired to be mounted within the housing. These panels boards may be fabricated from aluminum for bolting components in place; electrical insulating materials such as fiberglas, for swaging in bifurcated terminals to mount and wire electrical circuits of resistors, capacitors, etc.; or of copper clad insulating materials for printed circuits. The position of the panel boards 23 may be varied along the axis of the rods 20 by moving the adjustable nuts 24 and 25 carried on opposite sides of the panel boards 23. Sometimes it is desired that a plurality of printed circuit boards 26 be carried within the housing. This is accomplished by positioning a pair of panel boards 23 a predetermined distance apart and fastening conventional slotted brackets 27 to the side thereof. Conventional angle members 28 are provided adjacent the ends of the brackets 27, and have holes 29 positioned in a vertical column therein for receiving tabs (not shown) of conventional connectors 30 used with the printed circuit boards. The printed circuit boards 26 may be removed from the slotted brackets by sliding such away from the connectors 30.

As can be seen, depending on the length of the shell 16, many such printed circuits can be carried within the housing between adjacent panels 23. It is also understood, of course, that conventional circuitry which includes resistors, capacitors, etc., can be mounted on the panel boards 23.

FIG. 4 illustrates a completed container equipped with meters 31, dials 32 and switches 33 installed on the front panel 17. Wires 34 extend through an opening 35 in the front panel to the interior of the housing. These wires, if desired, could be inserted through front panel 17, or rear panel 18 of the housing by the use of standard electrical connectors, for mating and demating associated electrical test cables.

A bale-type handle 36 is attached to the shell 16 by any suitable means, such as by screws extending through the shell. In some applications it may be desirable to weld the handle 36 to the shell 16.

When the container is used in the labs there may be several size shells 16 available so that anyone desiring to use it can select a shell of the necessary length to house the equipment desired to be placed therein. It is then only necessary to mount the equipment on the panel boards 23 and the front panel 17 and assemble such with the nuts 22 and the rods 20. It is noted that the apexes 13 of the end rings 11 extend below the shell for supporting the housing. Since the end ring 11 is constructed of polyurethane, they replace the requirement for standard rubber feet and act as shock absorbers in case the housing is accidentally dropped. The outwardly extending flanges 14 protect the meters, knobs and switches 31, 32 and 33, respectively, carried on the front panel from being damaged.

I claim:

1. A housing capable of being readily assembled for housing components such as electric circuits and meters comprising:
   A. a first end ring having an inner wall and an outer wall constructed of polymeric material,
   B. said end ring having a groove disposed in said inner wall opening rearwardly and extending around said ring,
   C. a vertical ridge extending around said outer wall on an opposite side of said ring from said groove,
   D. an outwardly extending flange integral with said vertical ridge and extending around said ring,
   E. a second end ring corresponding to said first end ring spaced from said first end ring with said groove facing said groove in said first end ring,
   F. a thin wall elongated shell having a front and rear edge with a peripheral dimension corresponding to said grooves so that said front edge is carried in said groove of said first end ring and said rear edge is carried in said groove of said second end ring,
   G. a front panel carried flush against said vertical ridge of said first end ring,
   H. a rear panel carried flush against said vertical ridge of said second end ring, and
   I. elongated bolts extending between said front and rear panels for drawing such together firmly against said ridges, and for holding said edges of said shell within said grooves.

2. The housing as set forth in claim 1 further comprising:
   A. spaced vertical panel boards carried on said elongated bolts within said shell between said front and rear panels.

3. The housing as set forth in claim 2 wherein:
   A. said bolts are threaded from one end to the other,
   B. adjustable nuts carried on said bolts for engaging said panel boards in order to position said panel boards at predetermined locations within said housing.

4. The housing as set forth in claim 3 wherein:
   A. a pair of panel boards are carried on said bolts a predetermined distance apart,
   B. a plurality of printed circuits boards, and
   C. components carried on said printed circuit boards for supporting said printed circuit boards in a vertical stack.

5. The housing as set forth in claim 1 wherein:
   A. said end rings being constructed of polyurethane for acting as a shock absorber in case said housing is dropped.

* * * * *